United States Patent
Rochette

(10) Patent No.: US 6,989,608 B2
(45) Date of Patent: Jan. 24, 2006

(54) METHOD AND APPARATUS TO ELIMINATE GALVANIC CORROSION ON COPPER DOPED ALUMINUM BOND PADS ON INTEGRATED CIRCUITS

(75) Inventor: Philip A. Rochette, Colorado Springs, CO (US)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 10/817,619

(22) Filed: Apr. 1, 2004

(65) Prior Publication Data

US 2005/0224992 A1    Oct. 13, 2005

(51) Int. Cl.
*H01L 23/49*    (2006.01)
(52) U.S. Cl. ........................... 257/784; 257/741
(58) Field of Classification Search ......... 257/734–786
See application file for complete search history.

(56) References Cited

U.S. PATENT DOCUMENTS

| | | | |
|---|---|---|---|
| 4,478,915 A | 10/1984 | Poss et al. | 428/607 |
| 5,243,222 A * | 9/1993 | Harper et al. | 257/774 |
| 5,898,226 A * | 4/1999 | Jeong et al. | 257/786 |
| 6,794,248 B2 * | 9/2004 | Hashimoto et al. | 438/258 |
| 2002/0081776 A1 | 6/2002 | Tellkamp | 438/113 |

OTHER PUBLICATIONS

S. Thomas et al., "Micro-Corrosion of Al-Cu Bonding Pads", IEEE Transactions on Components, Hybrids, and Manufacturing Technology, Jun. 1987, vol. CHMT-10, No. 2, pp. 252-257.
Printout: Galvanic Voids, Semiconductor Reliability News, Apr. 1992, 1 page.

* cited by examiner

*Primary Examiner*—Howard Weiss
*Assistant Examiner*—Marcos D. Pizarro-Crespo
(74) *Attorney, Agent, or Firm*—Schneck & Schneck; Thomas Schneck

(57) ABSTRACT

The present invention is an electronic interconnect comprising a bond pad consisting essentially of aluminum and copper and configured for use in semiconductor electronic devices to couple a bond wire to an integrated circuit package. The bond pad has an oxide coating residing on at least a topmost surface of the bond pad. The oxide coating consists essentially of aluminum, copper, and oxygen. Therefore, the bond pad has little, if any, naturally occurring corrosion products such as hydrated aluminum hydroxide ($Al(OH)_3$) and/or $Al_2Cu$ particles. $Al(OH)_3$ films and $Al_2Cu$ particles have been shown to form on aluminum copper bond pads, preventing effective wire-bonding.

10 Claims, 3 Drawing Sheets

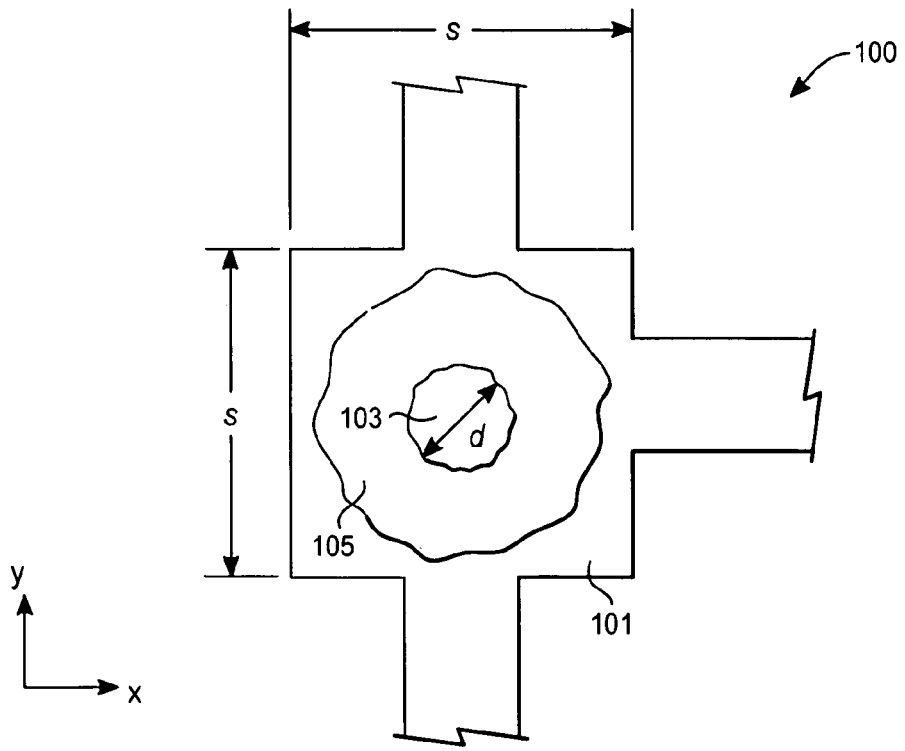
*Fig._1A* (Prior Art)
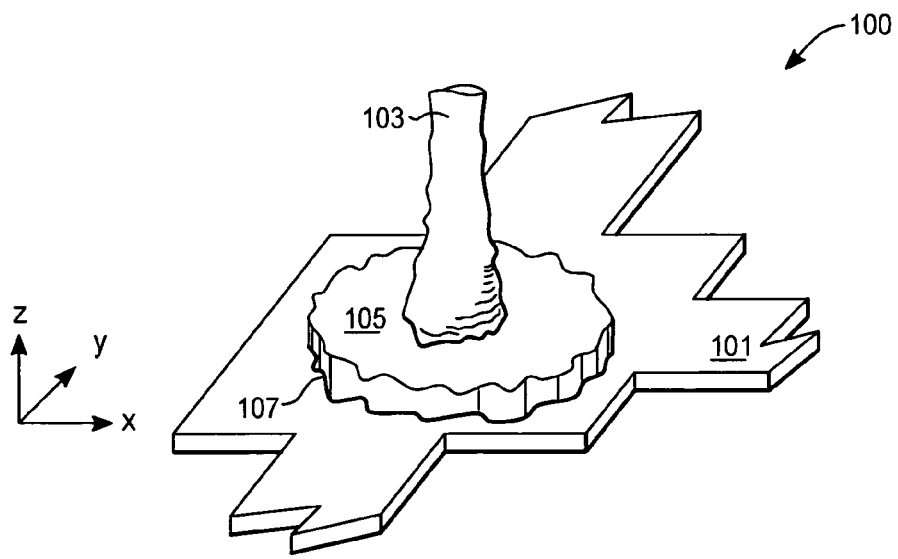
*Fig._1B* (Prior Art)

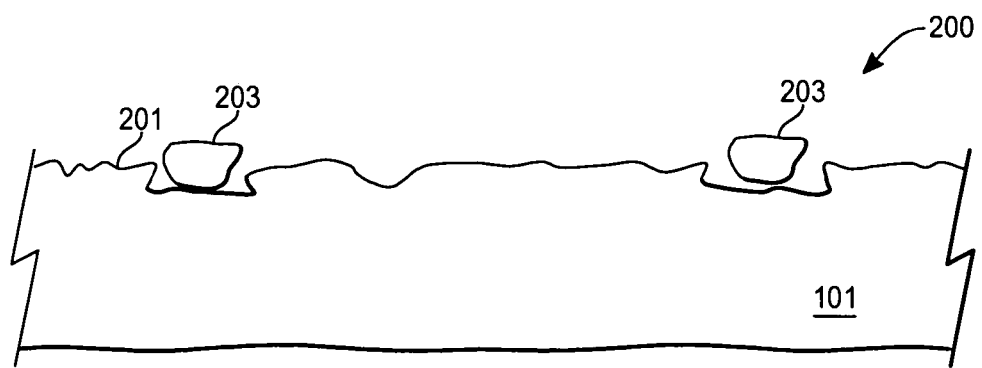
*Fig. \_2* (Prior Art)
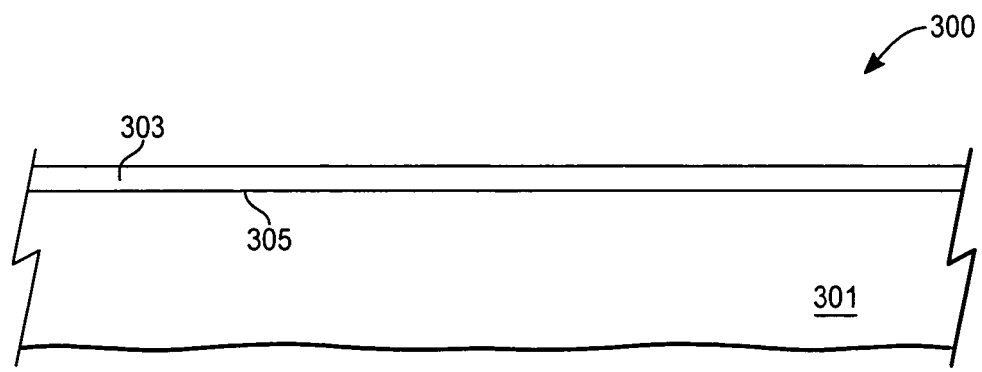
*Fig. \_3*

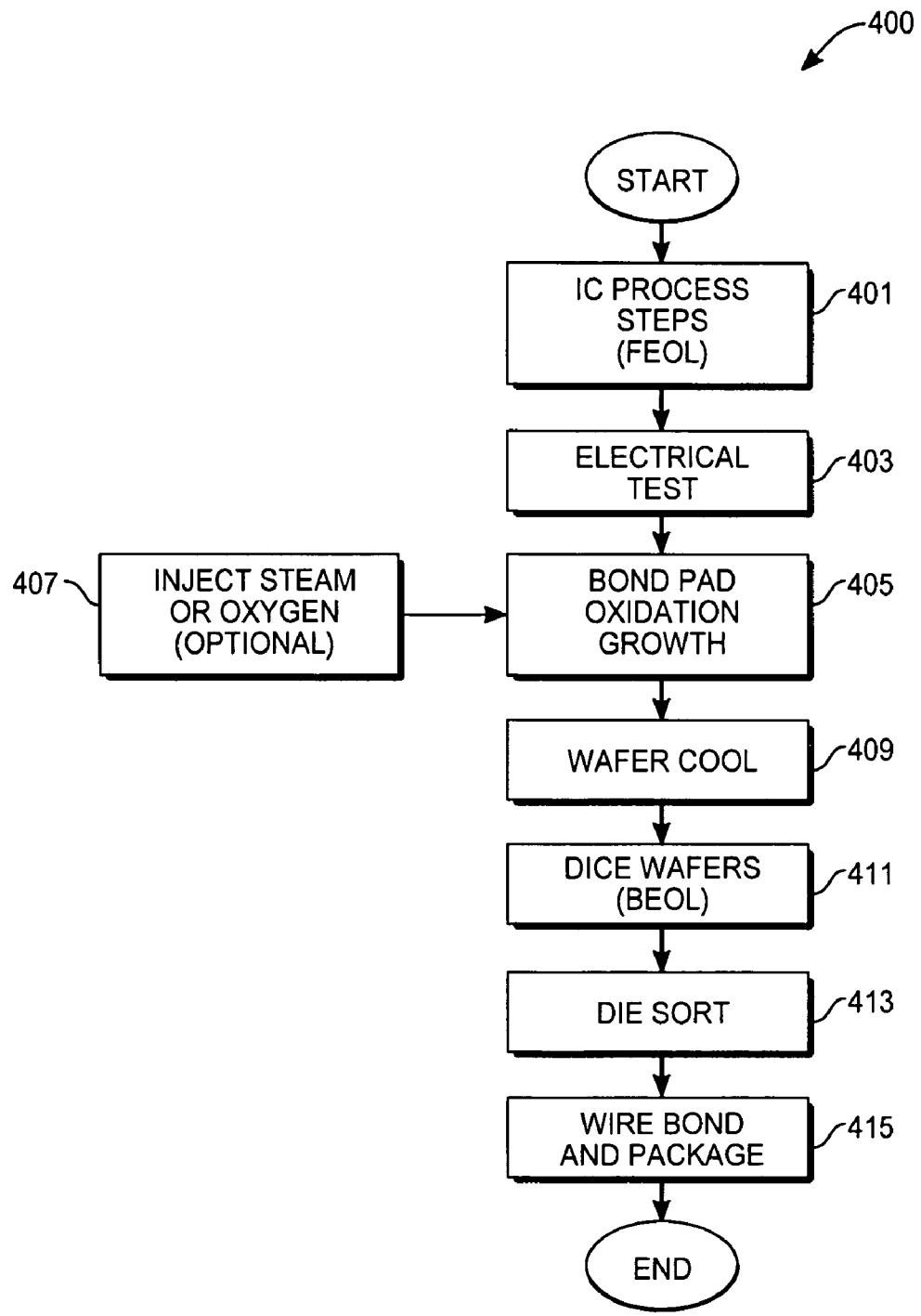
Fig._4

METHOD AND APPARATUS TO ELIMINATE GALVANIC CORROSION ON COPPER DOPED ALUMINUM BOND PADS ON INTEGRATED CIRCUITS

TECHNICAL FIELD

The present invention relates generally to an apparatus and method for semiconductor wire bonding. More specifically, the present invention pertains to an apparatus and method for eliminating galvanic corrosion on bond pads used for wire bonding.

BACKGROUND ART

Wire bonding is used to attach fine lead wires, typically 25 $\mu$m to 75 $\mu$m (i.e., 1–3 mils) in diameter, from one bond pad to another to complete an electrical connection in electronic devices. Lead wires are frequently made of gold, aluminum, silver, or copper. The bond pads can be interconnection areas formed on a semiconductor chip or metallized areas on interconnection substrates. In plastic encapsulated devices, semiconductor dice are wire bonded to metal lead frames. According to recent literature, approximately $4 \times 10^{12}$ lead wires are bonded every year, mostly in producing 40 to 50 billion integrated circuits fabricated annually, worldwide. Contemporary methods of wire bonding include wedge bonding and ball bonding. Both methods utilize thermocompression, ultrasonic, and thermosonic techniques. All of these techniques are well-known in the art and all rely on good mechanical and electrical contact between the lead wire and the bond pad.

FIG. 1A shows a plan view of a typical ball-bonded interconnect area 100. The bonded interconnect area 100 includes a bond pad 101, a lead wire 103, and a wire interconnect portion 105. The wire interconnect portion 105 is a portion of the lead wire 103 deformed through a combination of heat and ultrasonic energy applied while connecting the lead wire 103 to the bond pad 101. The bond pad 101 is frequently square in shape with a typical dimension, s, being 70 $\mu$m to 100 $\mu$m on a side and is typically located on a periphery of a silicon die for making connection with one of a plurality of package pins (not shown). A diameter, d, of the lead wire may be from 25 $\mu$m to 75 $\mu$m; as described above. FIG. 1B shows an isometric view of the bonded interconnect area 100. The bonded interconnect area 100 in FIG. 1B more clearly illustrates the wire interconnect portion 105 and additionally indicates a surface interface 107 between the wire interconnect portion 105 and the bond pad 101.

A majority of contemporary IC wafers fabricated employ aluminum-copper (or aluminum-copper-silicon) metallization for wire bond pads. A large proportion of all semiconductor-device failures are caused by wires inadequately bonded to a bond pad and known failure mechanisms are limited. A predominant failure mechanism is galvanic corrosion occurring on a bond pad. Galvanic corrosion occurs during a wafer saw operation to singulate the dice in a wafer. The formation of galvanic corrosion on the aluminum alloy bond pads causes voids, particles (e.g., $Al_2Cu$ particles), and a thin layer of aluminum hydroxide ($Al(OH)_3$) on a topmost surface of the bond pads (see, for example, "Micro-Corrosion of Al—Cu Bonding Pads"; S. Thomas et al., *IEEE Transactions on Components, Hybrids, and Manufacturing Technology*, Vol. CHMT-10, No. 2, June 1987, pgs. 252–257). The $Al_2Cu$ particles act as a local microscopic cathode in contact with the more anodic aluminum, causing corrosion in the presence of an electrolyte. The electrolyte here is deionized water used during a dicing operation. Even "high-resistivity unrecirculated deionized (DI) water" can cause the pitting problem (Thomas et al., pg. 256). Researchers have attempted to dry the bond pads after sawing but have had limited success. Further, there is no easy way to scale the drying operation to large scale manufacturing environments. Therefore, the galvanic corrosion problem continues to plague manufacturing lines.

FIG. 2 shows a cross-section 200 of the bond pad 101 of FIGS. 1A and 1B. A topmost surface of the bond pad 101 is shown exhibiting galvanic corrosion 201 and $Al_2Cu$ particles 203. Studies, such as that of Thomas et al., supra, indicate the $Al_2Cu$ particles are typically about 1 $\mu$m in "diameter." The galvanically corroded surface 201 and the $Al_2Cu$ particles 203 are the prime failure mechanisms preventing good mechanical and electrical bonding from occurring between the interface 107 of a wire interconnect portion 105 of the lead wire 103 and the bond pad 101 (FIGS. 1A and 1B).

Therefore, what is needed is a robust manufacturing method that economically and effectively controls the formation of galvanic corrosion on the bond pad 101.

DISCLOSURE OF THE INVENTION

The present invention is an electronic interconnect comprising a bond pad consisting essentially of aluminum and copper and configured for use in semiconductor electronic devices to couple a bond wire to an integrated circuit package. The bond pad has an oxide coating residing on at least a topmost surface of the bond pad. The oxide coating consists essentially of aluminum, copper, and oxygen. Therefore, the bond pad has little, if any, naturally occurring corrosion products such as hydrated aluminum hydroxide ($Al(OH)_3$) and/or $Al_2Cu$ particles. $Al(OH)_3$ films and $Al_2Cu$ particles have been shown to form on aluminum copper bond pads, preventing effective wire-bonding.

The electronic interconnect of the present invention may also be fabricated from aluminum-copper-silicon bond pads. In this case, the oxide coating consists essentially of aluminum, copper, silicon, and oxygen.

The present invention is also a method of fabricating aluminum copper bond pads. The method includes placing an electronic device (e.g., a wafer containing electronic devices) having aluminum-copper bond pads into an atmospheric oven, baking the electronic device at a temperature of greater than 50° C., maintaining the temperature of the oven containing the electronic device for at least 5 minutes, and oxidizing at least a topmost surface of the aluminum copper bond pads, thereby forming an oxide coating. The electronic device is then removed from the atmospheric oven and allowed to cool for at least 10 minutes prior to continuing IC packaging steps.

BRIEF DESCRIPTION OF DRAWINGS

FIG. 1A is a plan view of a typical ball-bonded interconnect area, commonly used in the semiconductor industry.

FIG. 1B is an isometric view of the ball-bonded interconnect area of FIG. 1A showing a wire lead bonded to the bond pad.

FIG. 2 is a cross-sectional view of the bond pad of FIGS. 1A and 1B showing a topmost region affected by galvanic corrosion.

FIG. 3 is a cross-sectional view of a bond pad having an oxide coating fabricated on top of the bond pad.

FIG. 4 is a flowchart showing a method for fabricating the oxide coating on the bond pad of FIG. 3.

MODES FOR CARRYING OUT THE INVENTION

With respect to FIG. 3, an exemplary embodiment of an oxidized bond pad 300 of the present invention containing an underlying aluminum-copper bond pad 301 with an oxide coating 303 is shown. The oxide coating 303 consists essentially of aluminum, copper, and oxygen and is fabricated on at least a topmost layer of the underlying bond pad 301 using techniques described infra. The oxide layer 303 prevents the galvanic corrosion 201 and particulate 203 products (FIG. 2) of contemporary processing techniques. Eliminating or reducing corrosion promotes adhesion of lead wires, attached, for example, either by wedge bonding or ball bonding techniques. Both techniques are well-known to one skilled in the art and will not be discussed further herein. Fabricating the oxide layer 303 prevents the galvanic corrosion 201 and particulate 203 products from forming at an interface 305 between the underlying bond pad 301 and the oxide layer 303. The oxide layer 303 is maintained sufficiently thin so as to allow good conductivity between the lead wire and the underlying bond pad 301, but also fabricated sufficiently thick thereby preventing corrosion at the interface 305. In one specific embodiment, thickness values of the oxide layer 303 vary between 5 nanometers (nm) and 1 micron ($\mu$m). In another specific embodiment, the oxide layer is between 5 nm and 50 nm. The oxide layer 303 thickness is typically chosen to be thin enough to be broken through by heat and vibration inherent in the bonding process. In an unrelated application, $CuAlO_2$ films were studied for use in optically transparent p-n junctions for flat-panel displays. In this study, a functional window of $CuAlO_2$ film transmitted visible light and generated electricity in response to an absorption of ultraviolet photons ("P-type Electrical Conduction in Transparent Thin Films of $CuAlO_2$"; H. Kawazoe et al., *Nature* 389, (1997), pgs. 939–942). The researchers found that $CuAlO_2$ films exhibit room-temperature p-type conductivity up to 1 S cm$^{-1}$. Therefore, $CuAlO_2$ exhibits a conductivity higher than many insulators commonly used in semiconductor processing (e.g., silicon dioxide or nitride). Consequently, $CuAlO_2$ does not exhibit the potentially detrimental insulating qualities of most oxides thereby allowing more latitude on an upper-end thickness value of the oxide layer 303. FIG. 4 shows an exemplary method 400 for fabricating the oxide layer 301 on bond pads. Processes in step 401 are typical front-end-of-line (FEOL) fabrication steps applied to most semiconductor wafers. The processes in step 401 typically include wafer cleaning, film deposition, patterning (e.g., lithography and etching), and metallization. Once the FEOL process steps 401 are completed, the wafer is electrically tested 403 by probe cards attached to automated testing equipment (ATE). Steps 401 and 403 are well-known in the art.

After electrical test 403, a bond pad oxidation growth step 405 occurs. The bond pad oxidation growth step 405 is performed by placing one or more processed wafers into an atmospheric oven, or, alternatively, into a diffusion furnace. Specific times and temperatures are described in detail, infra. Since ambient oxygen is utilized for oxide growth, no nitrogen pre-purge of the oven occurs. In a specific embodiment, an optional oxygen injection step 407 is added where supersaturated steam or pre-heated gaseous oxygen is introduced into the oven or furnace during the bond pad oxidation growth step 405.

The bond pad oxidation growth step 405 typically occurs at a temperature greater than 50° C., but no so high as to change the characteristics of the electronic device. A high-end temperature will be dependent on a particular device type and design-rules employed in making the device. For example, if a device employs fine design rules with thin gate oxides (e.g., less than 10 nm), a maximum temperature will be less than 700° C. In a specific embodiment, the bond pad oxidation growth step 405 takes place at a temperature of between 300° C. and 500° C. In another specific embodiment, the bond pad oxidation growth step 405 takes place at a temperature of between 340° C. and 350° C. As is well-known to one skilled in the art, oxidation growth is a function of temperature. As the temperature increases, shorter oxidation times are required for an equivalent film thickness. Generally, the wafers are heated for at least 5 minutes. More specifically, the wafers are heated for between 7 and 10 minutes.

After the bond pad oxidation growth step 405, the wafers are allowed to cool 409, typically, for at least 10 minutes. The cooled wafers are then diced (i.e., sent to a wafer saw operation) 411 and the dice are sorted 413 according to electrical test go/no-go rules. The good dice are wire bonded and packaged 415. Steps 411, 413, and 415 are typical back-end-of-line (BEOL) process steps that are well-known to one skilled in the art.

Although the detailed description and drawings describe various embodiments and methods for bond pad oxidation, one skilled in the art will recognize that other embodiments can readily be contemplated without departing from the intended scope of the device described. For example, the same techniques described herein are readily applicable to aluminum-copper-silicon bond pads as well. Therefore, the scope of the present invention shall only be limited by the appended claims.

What is claimed is:

1. An electronic interconnect, comprising:
   a bond pad, the bond pad consisting essentially of aluminum and copper and configured for use in semiconductor electronic devices to couple a bond wire to an integrated circuit package; and
   an oxide coating residing on at least a topmost surface of the bond pad, the oxide coating consisting essentially of aluminum, copper, and oxygen.

2. The electronic interconnect of claim 1, wherein the oxide coating is between 5 nanometers and 1 micrometer in thickness.

3. The electronic interconnect of claim 1, wherein the oxide coating is between 5 nanometers and 50 nanometers in thickness.

4. The electronic interconnect of claim 1, wherein the oxide essentially has a chemical composition of $CuAlO_2$.

5. The electronic interconnect of claim 1, wherein the bond pad and oxide coating also contain silicon.

6. An electronic interconnect which comprises:
   an aluminum-copper bond pad; and
   an oxide coating residing on at least a topmost surface of the bond pad, the oxide coating formed by baking the bond pad in an atmospheric oven at less than 500° C., the oxide coating further consisting of essentially aluminum, copper, and oxygen.

7. The electronic interconnect of claim 6, wherein the oxide coating also contains silicon.

8. An electronic interconnect, comprising:
a bond pad, the bond pad consisting essentially of aluminum, copper, and silicon and configured for use in semiconductor electronic devices to couple a bond wire to an integrated circuit package; and
an oxide coating residing on at least a topmost surface of the bond pad, the oxide coating consisting essentially of aluminum, copper, silicon, and oxygen.

9. The electronic interconnect of claim 8, wherein the oxide coating is between 5 nanometers and 1 micrometer in thickness.

10. The electronic interconnect of claim 8, wherein the oxide coating is between 5 nanometers and 50 nanometers in thickness.

* * * * *